United States Patent
Takeno et al.

(10) Patent No.: US 6,544,490 B1
(45) Date of Patent: Apr. 8, 2003

(54) SILICON WAFER AND PRODUCTION METHOD THEREOF AND EVALUATION METHOD FOR SILICON WAFER

(75) Inventors: Hiroshi Takeno, Gunma (JP); Hideki Shigeno, Gunma (JP); Makoto Iida, Gunma (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 0 days.

(21) Appl. No.: 09/869,932

(22) PCT Filed: Nov. 7, 2000

(86) PCT No.: PCT/JP00/07808

§ 371 (c)(1),
(2), (4) Date: Jul. 9, 2001

(87) PCT Pub. No.: WO01/36718

PCT Pub. Date: May 25, 2001

(30) Foreign Application Priority Data

Nov. 12, 1999 (JP) ............................................. 11-322242

(51) Int. Cl.[7] ............................................. C01B 33/26
(52) U.S. Cl. ......................... 423/328.2; 117/13; 117/20
(58) Field of Search ................... 117/13, 20; 423/328.2

(56) References Cited

U.S. PATENT DOCUMENTS 6,077,343 A * 6/2000 Iida et al. ...................... 117/2
6,261,361 B1 * 7/2001 Iida et al. ..................... 117/19

FOREIGN PATENT DOCUMENTS

| JP | 8-330316 | 12/1996 |
| JP | 11-199387 | 7/1999 |
| JP | 2000-7486 | 1/2000 |

OTHER PUBLICATIONS

M. Iida et al., "Effects of Light Element Impurities on the Formation of Grown–in Defects Free Region of Czochralski Silicon Single Crystal", Electrochemical Society Proceedings, vol. 99–1, papers presented during the 195th meeting of the electrochemical society, May 02–07, 1999, Seattle, WA, pp. 499–510.

V.V. Voronkov, Journal of Crystal Growth, 59 (1982), 625–643.

* cited by examiner

Primary Examiner—Felisa Hiteshew
(74) Attorney, Agent, or Firm—Oliff & Berridge, PLC

(57) ABSTRACT

A silicon wafer obtained by slicing a silicon single crystal ingot grown by the Czochralski method with or without nitrogen doping, wherein the silicon wafer has an NV-region, an NV-region containing an OSF ring region or an OSF ring region for its entire plane and has an interstitial oxygen concentration of 14 ppma or less, and a method for producing it, as well as a method for evaluating defect regions of a silicon wafer. Thus, there are provided a silicon wafer that stably provides oxygen precipitation regardless of position in crystal or device production process, and a method for producing it. Further, defect regions of a silicon wafer of which pulling conditions are unknown and thus of which defect regions are also unknown can be evaluated.

11 Claims, 9 Drawing Sheets

SILICON WAFER AND PRODUCTION METHOD THEREOF AND EVALUATION METHOD FOR SILICON WAFER

TECHNICAL FIELD

The present invention relates to a silicon wafer in which oxygen precipitation is stably obtained regardless of device production process and position in crystal and a method for producing it, as well as a method for evaluating defect regions of a silicon wafer of which pulling conditions are unknown.

BACKGROUND ART

In recent years, in connection with the use of finer devices accompanying the use of higher integration degree of semiconductor circuits such as DRAM, demand for quality of silicon single crystals produced by the Czochralski method (it may be also abbreviated as "CZ method" hereinafter) from which substrates therefor are produced is becoming higher. In particular, since there are defect called grown-in defects such as FPD, LSTD and COP and they degrade device characteristics, reduction of these defects is considered important.

Prior to explanation of those defects, there will be given first general knowledge of factors determining densities of defects introduced into silicon single crystals, a void type point defect called vacancy (also abbreviated as V hereinafter), and an interstitial type silicon point defect called interstitial silicon (interstitial-Si, also abbreviated as I hereinafter).

A V-region in a silicon single crystal means a region containing many vacancies, i.e., depressions, holes and so forth generated due to shortage of silicon atoms, and an I-region means a region containing many dislocations and aggregations of excessive silicon atoms generated due to excessive amount of silicon atoms. Between the V-region and the I-region, there should be a neutral region (also abbreviated as N-region hereinafter) with no (or little) shortage or no (or little) surplus of the atoms. Further, it has become clear that the aforementioned grown-in defects (FPD, LSTD, COP etc.) should be generated strictly only with supersaturated V or I, and they would not be present as defects even though there is little unevenness of atoms so long as V or I is not saturated.

It is known that densities of these two kinds of point defects are determined by the relationship between the crystal pulling rate (growing rate), and the temperature gradient G in the vicinity of the solid-liquid interface in the crystal in the CZ method. It has also been confirmed that defects distributed in a ring shape called OSF (Oxidation Induced Stacking Fault) are present in the N-region between the V-region and the I-region. Since OSFs are generated in a shape of concentric circle observed in a wafer surface when the wafer is sliced from a single crystal, there is used a term of OSF ring.

Those defects generated during the crystal growth are classified as follows. For example, when the growth rate is relatively high, i.e., around 0.6 mm/min or higher, grown-in defects considered to be originated from voids, i.e., aggregations of vacancy-type point defects, such as FPD, LSTD and COP, are distributed over the entire cross-section of the crystal along the radial direction at a high density, and a region containing such defects is called V-rich region (region in which supersaturated vacancies form void defects). When the growth rate is 0.6 mm/min or lower, with the decrease of the growth rate, the aforementioned OSF ring is initially generated at the circumferential part of the crystal, and L/D (large dislocations, abbreviation of interstitial dislocation loops, which include LSEPD, LFPD and so forth), which are considered to be originated from dislocation loops, are present outside the ring at a low density. A region containing such defects is called I-rich region (region in which supersaturated interstitial silicons form dislocation loop defects). When the growth rate is further lowered to around 0.4 mm/min or lower, the OSF ring shrinks and disappears at the center of wafer, and thus the entire plane becomes the I-rich region.

Recently, there has been discovered a region called N-region between the V-rich region and the I-rich region, and outside the OSF ring, in which neither of the void-originated FPD, LSTD and COP, the dislocation loop-originated LSEPD and LFPD and OSF are present. This region exists outside the OSF ring, and shows substantially no oxygen precipitation when it is subjected to a heat treatment for oxygen precipitation and examined by X-ray analysis or the like as for the precipitation contrast. This region is present at rather I-rich side, and the interstitial silicon point defects are not so rich as to form LSEPD and LFPD.

Presence of the N-region was also confirmed inside the OSF ring, in which neither of void-originated defects, dislocation loop-originated defects and OSFs were present.

Because these N-regions are formed obliquely with respect to the growing axis when the growth rate is lowered in a conventional growing method, it exists as only a part of the wafer plane.

As for this N-region, according to the Voronkov's theory (V. V. Voronkov, Journal of Crystal Growth, 59 (1982) 625–643), it was proposed that a parameter of F/G, which is a ratio of the pulling rate (F) and the crystal solid-liquid interface temperature gradient (G) along the growing axis, determined the total density of the point defects. In view of this, because the pulling rate should be constant in a plane, for example, a crystal having a V-rich region at the center, I-rich region at the periphery, and N-region between them is inevitably obtained at a certain pulling rate due to distribution of G in the plane.

Therefore, improvement of such distribution of G has recently been attempted, and it has become possible to produce a crystal having the N-region spreading over an entire transverse plane of the crystal, which region could previously exist only obliquely, for example, at a certain pulling rate when the crystal is pulled with a gradually decreasing pulling rate F. Further, such an N-region spreading over an entire transverse plane can be made larger to some extent along the longitudinal direction of the crystal by pulling the crystal at a pulling rate maintained at the value at which the N-region transversely spreads. Furthermore, it has also become possible to make the N-region spreading over the entire transverse plane somewhat larger along the growing direction by controlling the pulling rate considering the variation of G with the crystal growth to compensate it, so that the F/G should strictly be maintained constant.

As further classification of the N-region, it is known that there are NV-region (region in which there are many vacancies, but void defects are not detected), which is present outside the OSF ring and adjacent to it, and NI-region (region in which there are many interstitial silicons but dislocation loop defects are not detected), which is adjacent to the I-rich region.

Furthermore, in a silicon substrate produced by the CZ method, control of oxygen precipitation is becoming increasingly important in view of internal gettering effect against heavy metal impurities in addition to the importance of the reduction of such grown-in defects. However, since the oxygen precipitation strongly depends on the heat treatment conditions, it is a very difficult problem to obtain suitable oxygen precipitation in the device production process, which may be different for every user. Furthermore, wafers are subjected to a heat treatment not only in the device production step, but also a heat treatment in the crystal pulling step, in which the temperature is changed from the melting point to room temperature (thermal history of crystal). Therefore, in an as-grown crystal, there already exist oxygen precipitation nuclei formed during the thermal history of the crystal (grown-in precipitation nuclei). Such presence of grown-in precipitation nuclei makes the control of oxygen precipitation still difficult.

The oxygen precipitation process in the device production process can be classified into two kinds of processes. One is a process in which grown-in precipitation nuclei that remained after the initial heat treatment of the device production step grow, and the other one is a process in which nuclei generated during the device production step grow. In the latter case, since the oxygen precipitation strongly depends on oxygen concentration, it can be controlled by controlling the oxygen concentration. On the other hand, in the former case, thermal stability of grown-in precipitation nuclei (i.e., at how much degree of density they can remain at the temperature of the initial stage of the process) constitutes an important point.

For example, even if the grown-in precipitation nuclei exist at a high density, if they have a small size, they become thermally unstable and disappear during the initial heat treatment of the device production process. Thus, oxygen precipitation cannot be secured. The problem in this case is that, since the thermal stability of grown-in precipitation nuclei strongly depends on the thermal history of crystal, oxygen precipitation behavior may markedly vary in the device production step depending on the crystal pulling conditions or position in the crystal along the crystal axis even for wafers having the same initial oxygen concentration. Therefore, in order to control the oxygen precipitation in the device production step, it is important to control not only the oxygen concentration but also the thermal stability of grown-in precipitation nuclei by controlling the thermal history of crystal.

Although development of techniques for reducing the aforementioned grown-in defects is currently proceeding, the thermal history of low defect crystals produced by such techniques is controlled in order to reduce grown-in defects. It is considered that this also changes the thermal stability of grown-in precipitation nuclei. However, it is not known at all how much degree it is changed.

Therefore, it is expected that the oxygen precipitation behavior in such low defect crystals may significantly vary in the device production step, and it results in reduction of device yield.

Further, since no method for judging from which defect region a wafer is produced has been established as for a wafer of which defect regions are unknown, it is difficult to predict oxygen precipitation behavior in the wafer during the device production step.

DISCLOSURE OF THE INVENTION

Therefore, the present invention was accomplished in view of the aforementioned problems, and its object is to provide a silicon wafer that stably provides oxygen precipitation regardless of position in crystal or device production process, and a method for producing it. Another object of the present invention is to provide a method for evaluating defect regions of a silicon wafer of which pulling conditions are unknown and thus of which defect regions are also unknown.

The present invention was accomplished in order to achieve the aforementioned objects, and provides a silicon wafer having an NV-region, an NV-region containing an OSF ring region or an OSF ring region for the entire plane of the silicon wafer and having an interstitial oxygen concentration of 14 ppma (Japan Electronic Industry Development Association (JEIDA) Standard) or less.

If an entire plane of silicon wafer consists of a NV-region, OSF ring region or both of them as described above, there would be an appropriate amount of thermally stable large grown-in precipitation nuclei, therefore fluctuation of oxygen precipitation becomes little even if the device process may be different, and BMDs (oxide precipitates called Bulk Micro Defects) can be stably obtained. Further, if an interstitial oxygen concentration is 14 ppma or less, density of small grown-in precipitation nuclei becomes low, and therefore the wafer can be a silicon wafer showing reduced fluctuation of oxide precipitates depending on the position in crystal.

The present invention also provides a silicon wafer obtained by slicing a silicon single crystal ingot grown by the Czochralski method with nitrogen doping, wherein the silicon wafer has an NV-region, an NV-region containing an OSF ring region or an OSF ring region for its entire plane.

If a silicon wafer is doped with nitrogen and has a NV-region, OSF ring region or both of them for the entire plane as described above, thermally stable large grown-in precipitation nuclei will be obtained at a high density, and therefore it becomes a silicon wafer providing sufficient gettering effect in the device production process.

In this case, nitrogen concentration doped in the silicon wafer is $1 \times 10^{10}$ to $5 \times 10^{15}$ number/cm$^3$.

That is, the above range was defined because at least a nitrogen concentration of $1 \times 10^{10}$ number/cm$^3$ or more is necessary in order to obtain BMDs at an extremely high density by the effect of nitrogen doping, and a concentration of more than $5 \times 10^{15}$ number/cm$^3$ may inhibit single crystallization during the pulling of a single crystal ingot by the CZ method.

Further, also in the case of a wafer doped with nitrogen, if the interstitial oxygen concentration is 14 ppma or less, the density of small grown-in precipitation nuclei become low, and hence the fluctuation of oxide precipitates depending on the position in crystal can be reduced.

The present invention also provides a method for producing a silicon wafer, wherein, when a silicon single crystal is grown by the Czochralski method, the crystal is pulled with such conditions as present in an NV region or an OSF ring region in a defect distribution chart showing defect distribution which is plotted with D [mm] in the horizontal axis and F/G [mm$^2$/° C.·min] in the vertical axis, wherein D represents a distance between center of the crystal and periphery of the crystal, F [mm/min] represents a pulling rate and G [° C./mm] represents an average temperature gradient in the crystal along the crystal pulling axis direction in the temperature range of from the melting point of silicon to 1400° C., so that interstitial oxygen concentration should become 14 ppma or less.

If a crystal is pulled while the pulling rate F of the crystal and the average temperature gradient G in the crystal along the crystal pulling axis direction in the temperature range of from the melting point of silicon to 1400° C. are controlled so that the conditions should be present in a region defined by a boundary between a V-rich region and an NV-region and a boundary between an NV-region and an NI-rich region in the defect distribution chart shown in FIG. 8, which was obtained through analysis of the results of experiments and researches, as described above, a silicon wafer obtained by slicing the grown single crystal ingot can have an NV-region, NV-region containing an OSF ring region or an OSF ring region for its entire plane, and at the same time, the crystal can be pulled so that an interstitial oxygen concentration should become 14 ppma or less.

In such a region, there would be an appropriate amount of thermally stable large grown-in precipitation nuclei. Therefore, fluctuation of oxygen precipitation becomes little even if the device process may be different, and BMDs can be stably obtained. Further, because the interstitial oxygen concentration is 14 ppma or less, density of small grown-in precipitation nuclei becomes low, and therefore the fluctuation of oxide precipitates depending on the position in crystal can be reduced.

The present invention also provides a method for producing a silicon wafer, wherein, when a silicon single crystal is grown by the Czochralski method, the crystal is pulled with such conditions as present in an NV region or an OSF ring region in a defect distribution chart showing defect distribution which is plotted with D [mm] in the horizontal axis and F/G [mm$^2$/° C.·min] in the vertical axis, wherein D represents a distance between center of the crystal and periphery of the crystal, F [mm/min] represents a pulling rate and G [° C./mm] represents an average temperature gradient in the crystal along the crystal pulling axis direction in the temperature range of from the melting point of silicon to 1400° C., and with nitrogen doping.

If a crystal is pulled with such conditions as described above, a silicon wafer obtained by slicing the grown single crystal ingot can be doped with nitrogen and have an NV-region, an NV-region containing an OSF ring region or an OSF ring region for its entire plane.

If a wafer is doped with nitrogen and has an NV-region, OSF ring region or both of them for its entire plane as described above, thermally stable large grown-in precipitation nuclei can be obtained at a high density, and therefore a wafer that can provide sufficient gettering effect in the device production process can be produced.

In this case, nitrogen concentration to be doped can be $1 \times 10^{10}$ to $5 \times 10^{15}$ number/cm$^3$.

Further, also in this case, when a crystal is grown by the CZ method, the crystal can be pulled so that the interstitial oxygen concentration should become 14 ppma or less.

In order to obtain BMDs in an extremely high density by the effect of nitrogen doping as described above, a nitrogen concentration of $1 \times 10^{10}$ number/cm$^3$ or more is necessary. But if the concentration exceeds $5 \times 10^{15}$ number/cm$^3$, the single crystallization may be inhibited during the pulling of a single crystal ingot by the CZ method. Therefore, a concentration of $5 \times 10^{15}$ number/cm$^3$ or less is preferred.

Further, even when nitrogen is doped, if the interstitial oxygen concentration is 14 ppma or less, the density of small grown-in precipitation nuclei becomes low. Therefore, the fluctuation of oxide precipitates depending on the position in crystal can be reduced.

The present invention further provides a method for evaluating defect regions of a silicon wafer produced by the CZ method, wherein a defect region of a silicon wafer to be evaluated is evaluated by comparing at least two of oxide precipitate densities measured by the following steps:

(1) a wafer to be evaluated is divided into two or more pieces (A, B, . . . ), (2) Wafer piece A among the divided pieces is loaded into a heat treatment furnace maintained at a temperature of T1 [° C.] selected from a temperature range of 600–900° C., (3) the temperature is increased from T1 [° C.] to a temperature of 1000° C. or higher, T2 [° C.], at a temperature increasing rate of t [° C./min] (provided that t is 3° C./min or less), and the temperature is maintained until oxide precipitates in Wafer piece A grow to have a detectable size, (4) Wafer piece A is unloaded from the heat treatment furnace, and oxide precipitates density in the wafer piece is measured, (5) another wafer piece among the divided wafer pieces, Wafer piece B, is loaded into a heat treatment furnace maintained at a temperature of T3 [°0 C.] selected from a temperature range of 800–1100° C. (provided that T1<T3<T2), (6) the temperature is increased from T3 [° C.] to the temperature of T2 [° C.] at the temperature increasing rate of t [° C./min], and the temperature is maintained until oxide precipitates in Wafer piece B grow to have a detectable size, and (7) Wafer piece B is unloaded from the heat treatment furnace, and oxide precipitates density in the wafer piece is measured.

As for a wafer of which defect regions are unknown, no method for judging from which defect region the wafer is produced has hitherto been established. Therefore, it has been difficult to predict oxygen precipitation behavior of the wafer in the device production step. However, by the aforementioned method for evaluating defect regions, defect regions of wafer of which pulling conditions are unknown and thus of which defect regions are also unknown can be evaluated, and at the same time, it becomes possible to predict oxygen precipitation behavior of the wafer in the device production step.

As described above, according to the present invention, stable oxygen precipitation can be obtained regardless of the position in crystal or the device production process, and therefore a wafer showing little fluctuation of oxide precipitate density and stable gettering ability can be obtained. Furthermore, by using the evaluation method of the present invention, defect regions of wafer of which pulling conditions are unknown and thus of which defect regions are also unknown can be judged relatively easily.

(a) density difference of BMD density for 700° C. and BMD density for 800° C., i.e., density distribution for only extremely small precipitation nuclei according to position in crystal, (b) difference of BMD densities for 800° C. and 900° C., and density distribution according to position in crystal, (c) difference of BMD densities for 900° C. and 1000° C., and density distribution according to position in crystal, and (d) BMD density distribution according to position in crystal for 1000° C. or higher.

Figure 3:
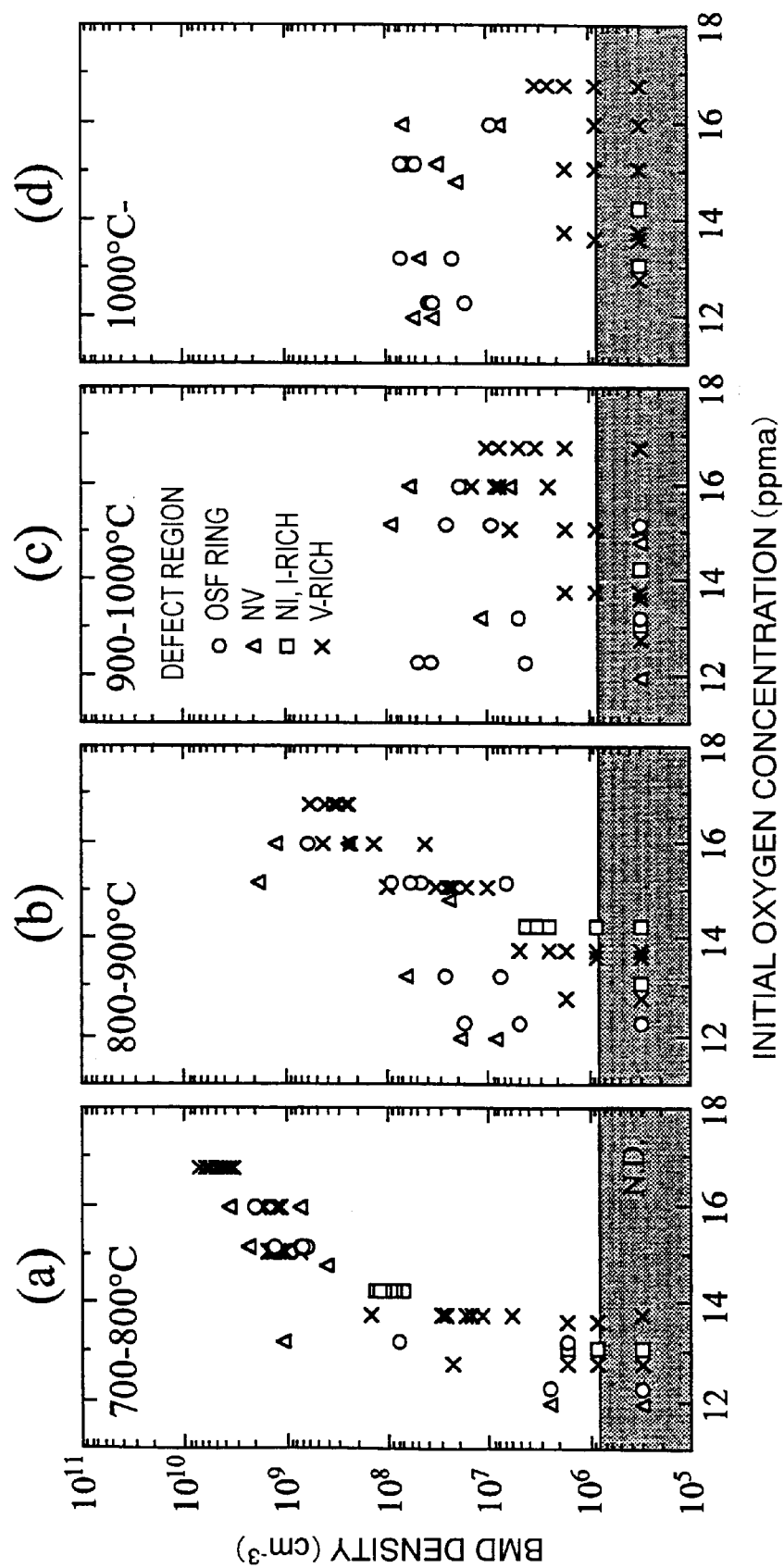
Figure 4:
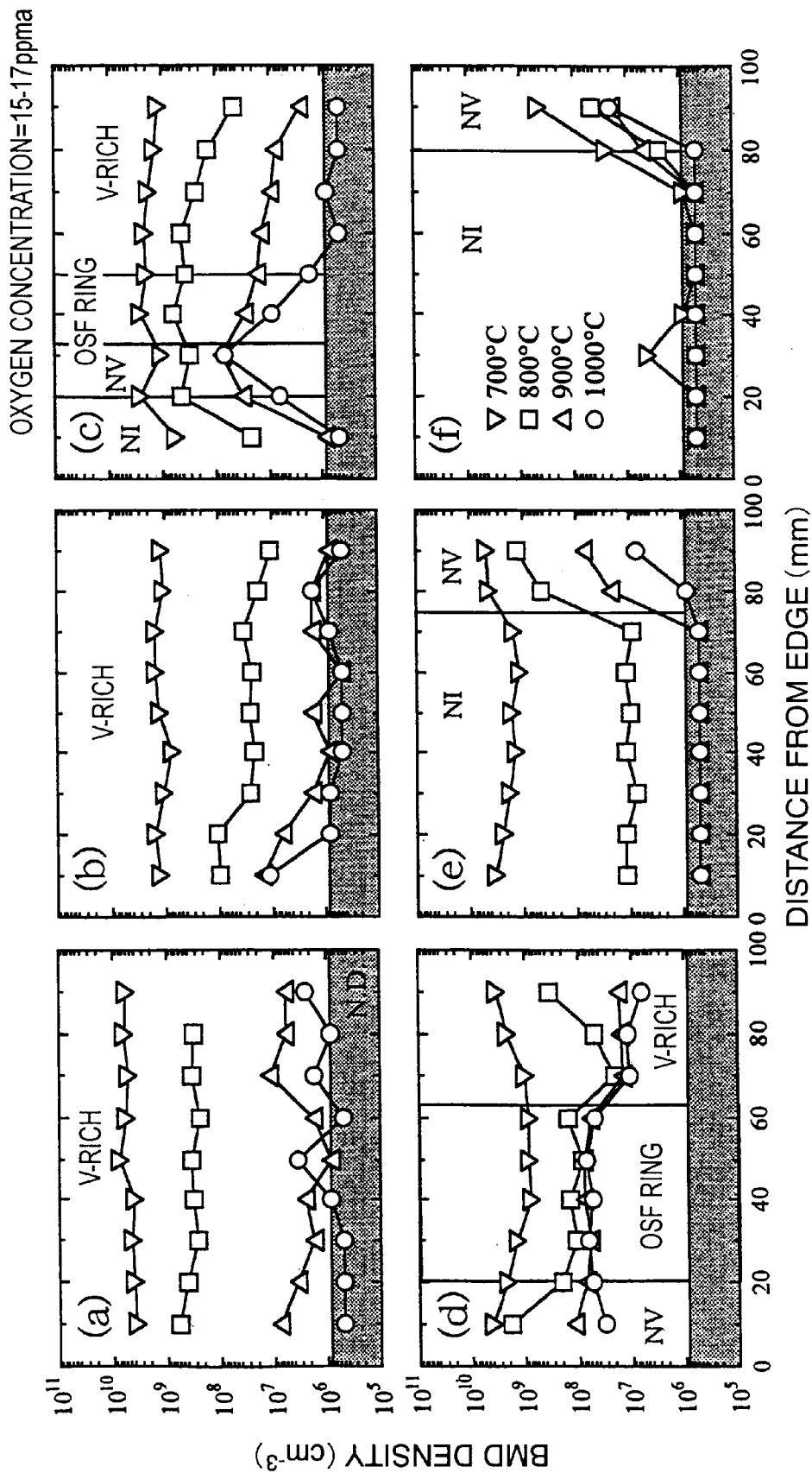
Figure 5:
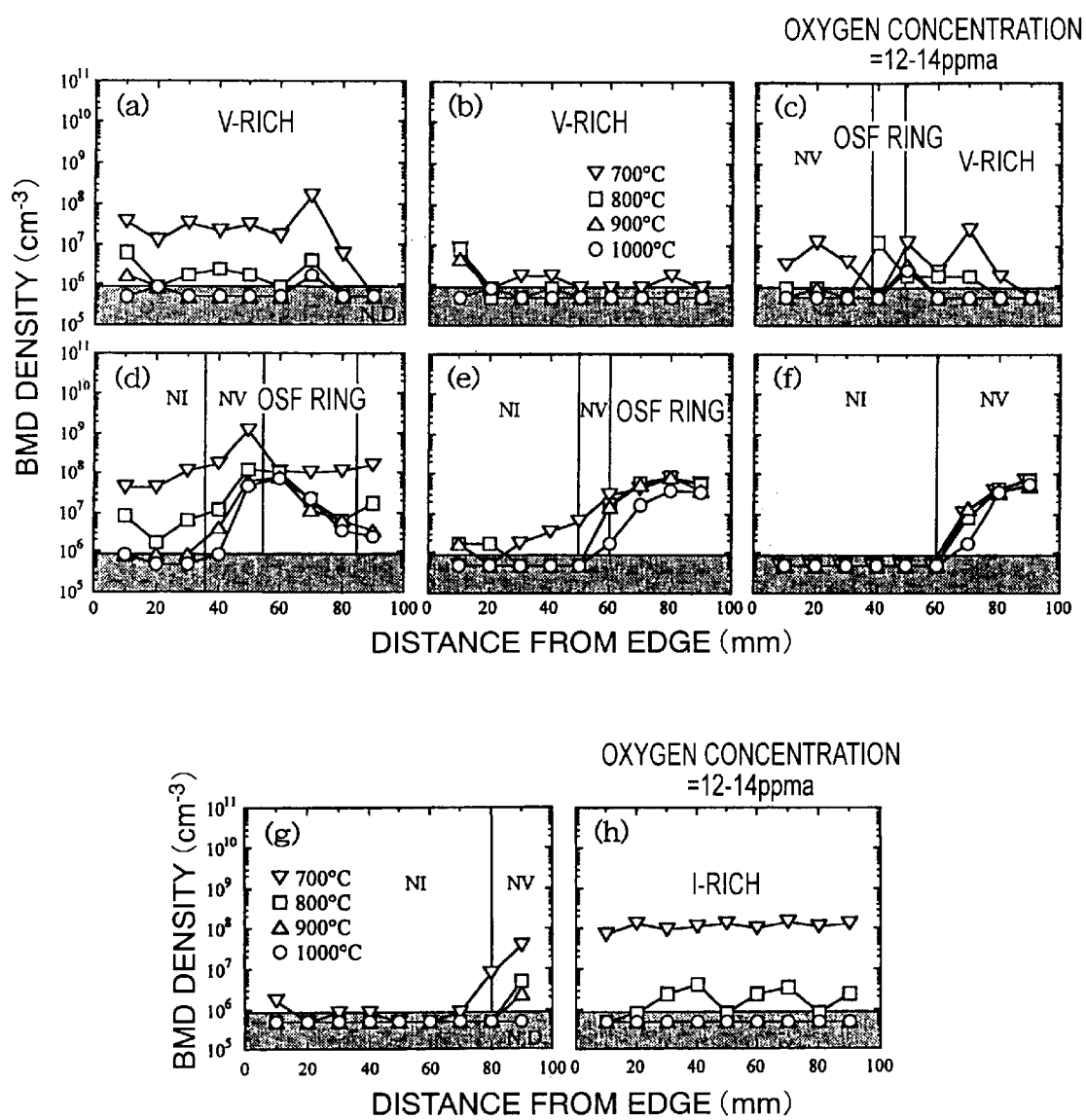

FIG. 3 shows graphs representing the results for oxygen concentration dependency of BMD density considering influences of defect region:

(a) difference of BMD densities for 700° C. and 800° C., and BMD density distribution according to defect region, (b) difference of BMD densities for 800° C. and 900° C., and BMD density distribution according to defect region, (c) difference of BMD densities for 900° C. and 1000° C., and BMD density distribution according to defect region, and (d) BMD density distribution according to defect region for 1000° C. or higher.

FIGS. 4(a) to (f) show graphs representing distribution of BMD density in plane for high oxygen concentration wafers.

FIGS. 5(a) to (h) show graphs representing distribution of BMD density in plane for low oxygen concentration wafers.

Figure 6:
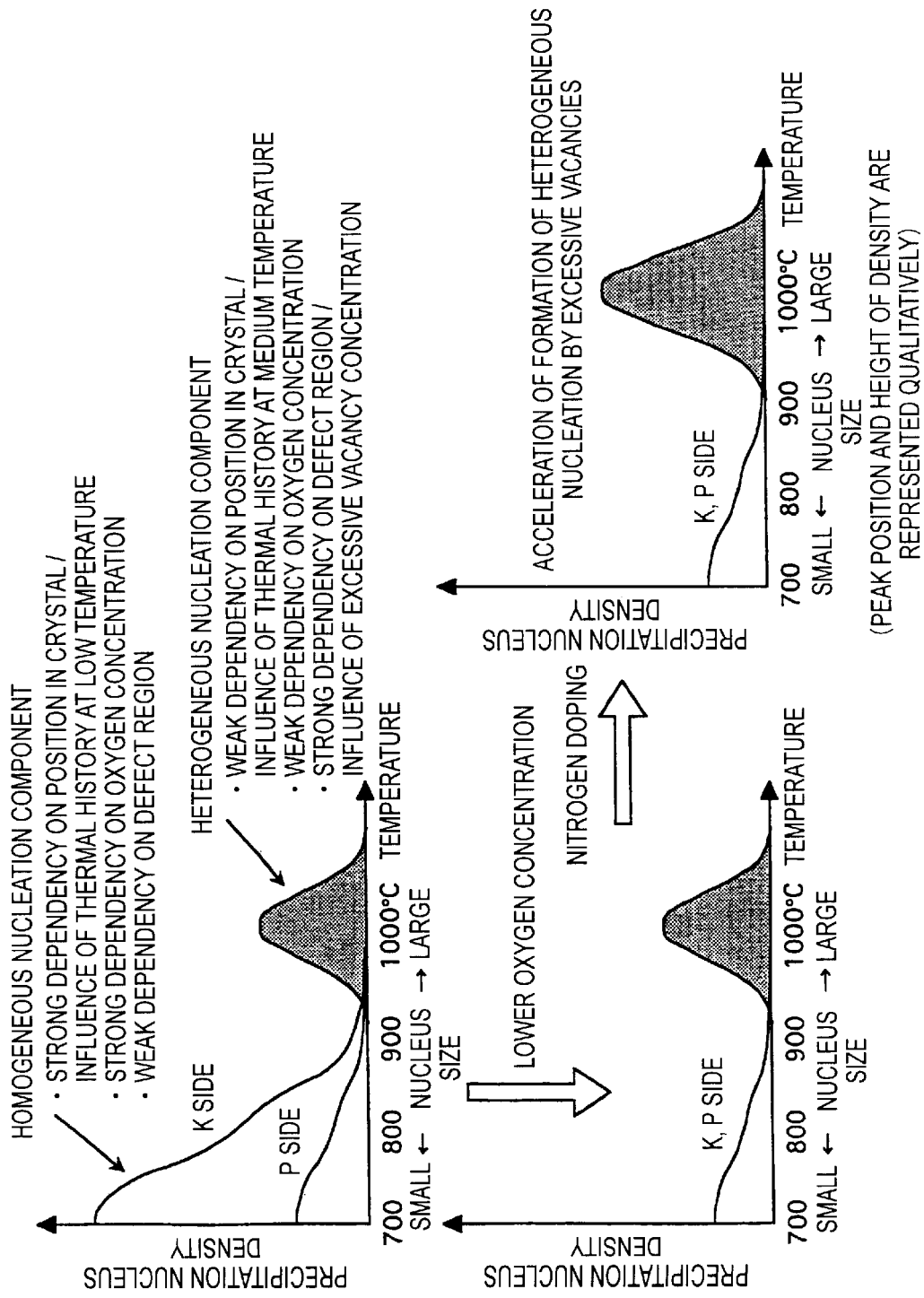

FIG. 6 shows an explanatory diagram for a method of reducing fluctuation of oxygen precipitation nuclei density according to position in crystal.

Figure 7:
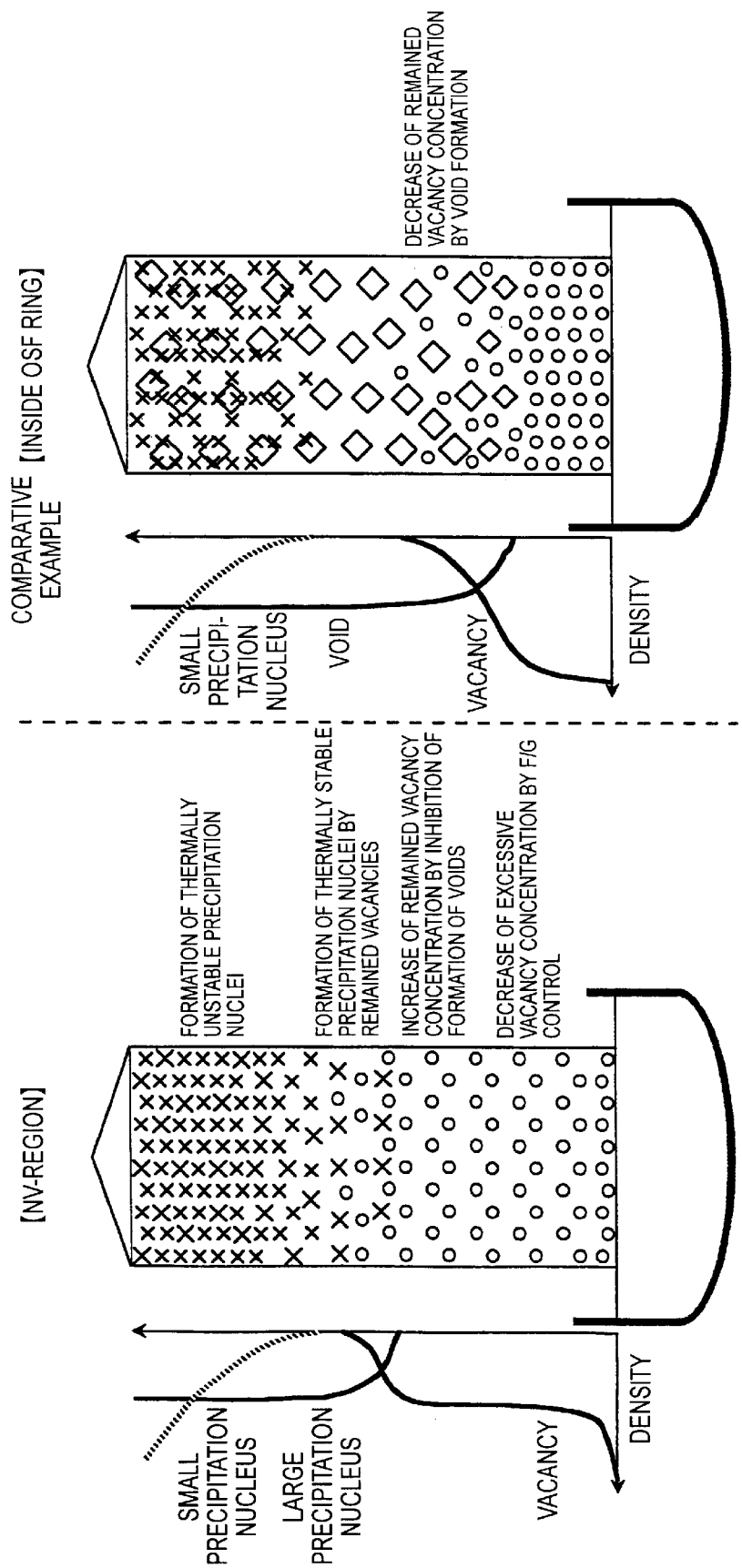

FIG. 7 shows an explanatory diagram for a method of increasing oxygen precipitation nuclei density in NV-region.

Figure 8:
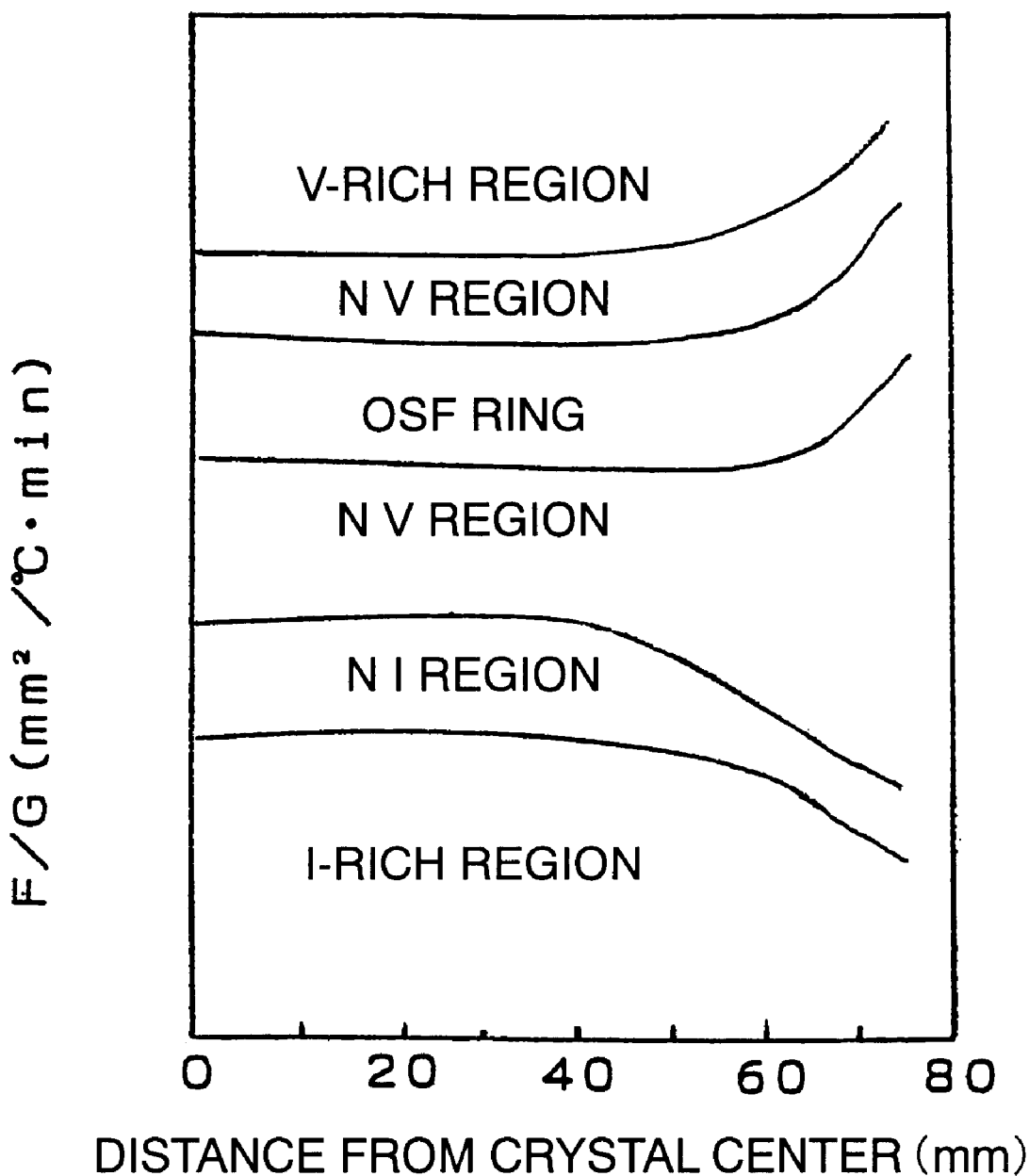

FIG. 8 shows a chart representing distribution of various defects, in which the horizontal axis indicates position in the crystal along the radial direction and the vertical axis indicates F/G value.

Figure 9:
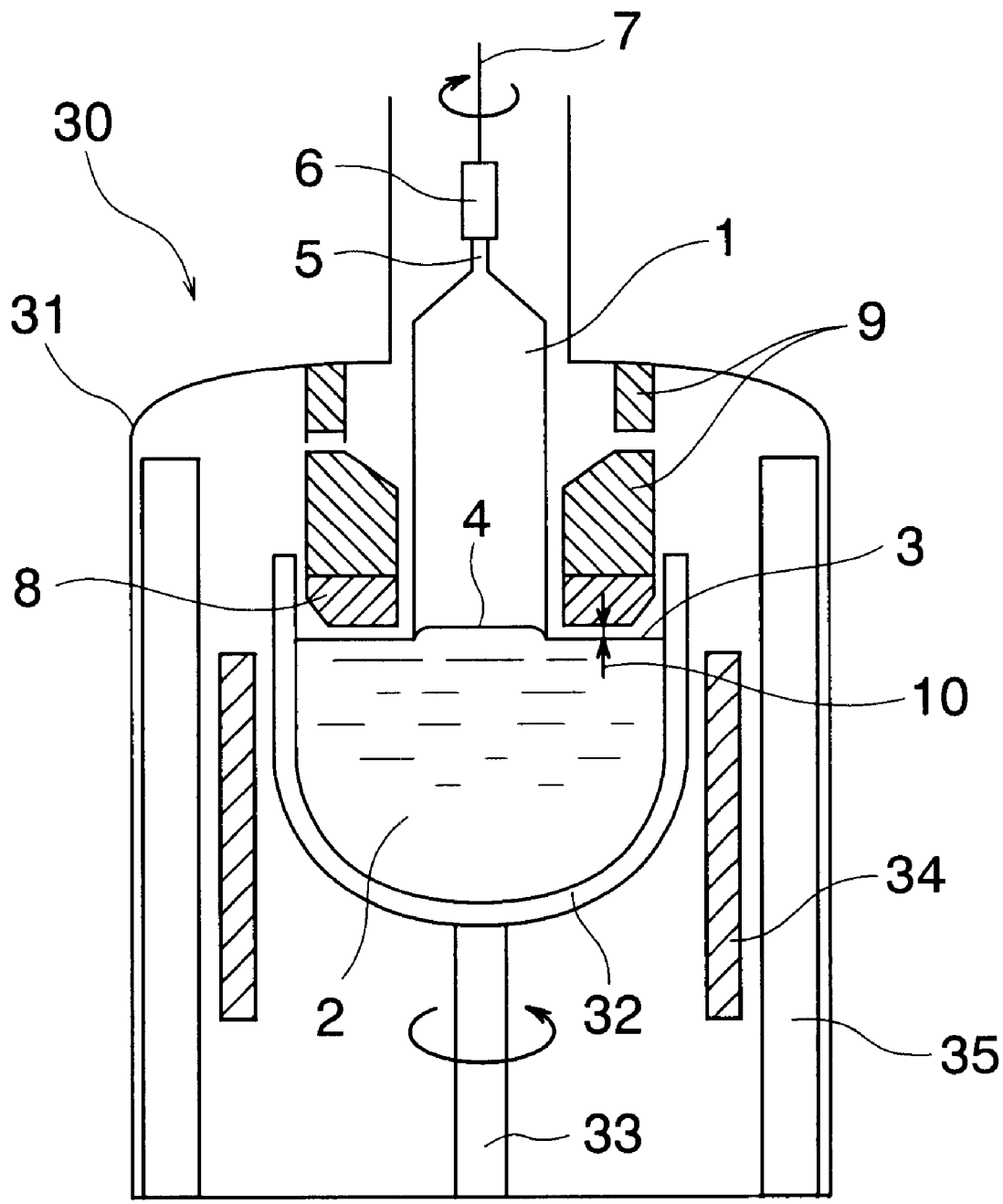

FIG. 9 is a schematic view showing a single crystal pulling apparatus based on the CZ method used in the present invention.

BEST MODE FOR CARRYING OUT OF THE INVENTION

Hereafter, the present invention will be explained in more detail.

The inventors of the present invention investigated thermal stability of grown-in precipitation nuclei by performing the following experiments.

First, several kinds of wafers having different defect regions were prepared, and subjected to the following heat treatments.

After the wafers were loaded into a furnace set at T° C. (T=700, 800, 900, 1000), the temperature was increased at a rate of 1.5° C./minute from T° C. to 1050° C., and maintained at 1050° C. for 4 hours. In this heat treatment, grown-in precipitation nuclei stable at a temperature of T° C. or higher were grown to have such a size that they should not disappear at 1050° C. by the temperature increase at a slow rate and they were further grown to have a size detectable by a conventional evaluation method by maintaining them at 1050° C. for 4 hours.

An important point was that the grown-in precipitation nuclei were fully grown by the optimization of temperature increasing rate, and the conditions were selected so that precipitation nuclei should not be newly generated in the heat treatment step. Therefore, the oxide precipitate (BMD: Bulk Micro Defect) density after this heat treatment would represent a density of grown-in precipitation nuclei stable at a temperature of T° C. or higher. The BMD density after the heat treatment was measured by infrared laser scattering tomography method (LST). The measurement were performed at position at a distance of 10 mm from the edge and those at distances increased by a 10 mm interval toward the center for a region having a depth of about 50–180 μm from the surface.

As a result of the experiments described above, it was found that the thermal stability of grown-in precipitation nuclei was influenced by the defect regions defined by the OSF ring (region inside the ring, ring region, and region outside the ring), oxygen concentration, and the position along the crystal axis direction. The results will be explained below.

(1) Relationship Between Grown-in Precipitation Nuclei and Defect Regions

Figure 1:
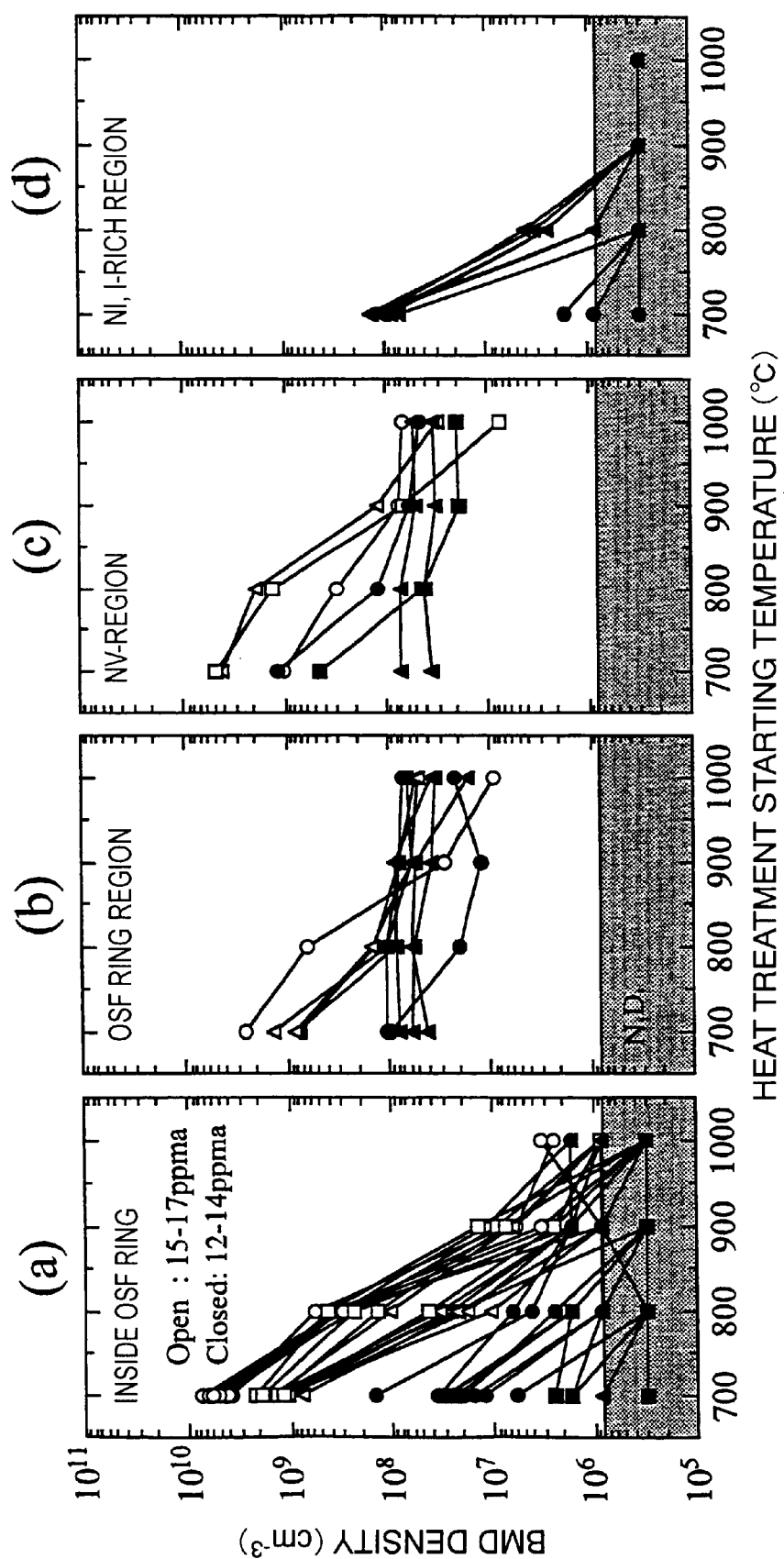
FIG. 1 shows graphs representing relationship between heat treatment starting temperature and BMD density for (a) region inside the OSF ring, (b) OSF ring region, (c) NV-region, and (d) NI-region and I-rich region.

The relationship between the heat treatment starting temperature T° C. and BMD density is shown in FIG. 1. The closed symbols represent the results for low oxygen concentration wafers (12–14 ppma) and the open symbols represent the results for high oxygen concentration wafers (15–17 ppma). While the different shapes of the symbols indicate the different wafers (different pulling conditions), such difference will not be discussed herein.

In these graphs, for example, the BMD density of $1\times10^9$/cm$^3$ for 700° C. indicates that the density of grown-in precipitation nuclei that can remain at 700° C. is $1\times10^9$/cm$^3$. In theory, if the temperature becomes higher, size of the precipitation nuclei that can remain at that temperature (critical size) will become larger. Large precipitation nuclei that can remain at a high temperature can remain also at a low temperature. Therefore, BMD density for 700° C. means a density of all precipitation nuclei that can remain at a temperature of 700° C. or higher.

(1-1) Region Inside OSF Ring (V-rich Region)

FIG. 1(a) shows the results for the region inside the OSF ring. As the heat treatment starting temperature became higher, the BMD density became lower. That is, a larger size of precipitation nuclei provided a lower density of them. In particular, above 900° C., the density became extremely low, i.e., less than the order of $10^6$/cm$^3$. This shows that the density of thermally stable comparatively large grown-in precipitation nuclei is extremely low in the region inside the OSF ring. Further, since they show strong temperature dependency, it is expected that different device production process conditions (initial stage heat treatment temperatures) would provide significantly different BMD densities.

(1-2) OSF Ring Region and NV-region

The results in the OSF ring region and the NV-region are shown in FIGS. 1(b) and (c), respectively. The results for the both showed substantially the same tendency. It can be seen that the BMD density for 900° C. or higher was clearly higher than the region inside the OSF ring. That is, the density of thermally stable precipitation nuclei was high. It can be seen that, since the temperature dependency became weak, difference of the device production process conditions did not provide significant change of BMD density. The OSF ring region and the NV-region showed significant difference, i.e., OSFs were generated or not by oxidation at high temperature. It is considered that this difference originated in the difference in density of precipitation nuclei stable at a temperature higher than 1000° C.

(1-3) NI- and I-rich Regions

The results in the NI- and I-rich regions are shown in FIG. 1(d). Although there are few data, the tendency was substantially the same as the region inside the OSF.

From the above results, it was found that, by measuring BMD densities in heat treatments of which starting temperature were 800° C. and 1000° C., for example, the kind of defect region of a corresponding wafer could be determined.

Figure 2:
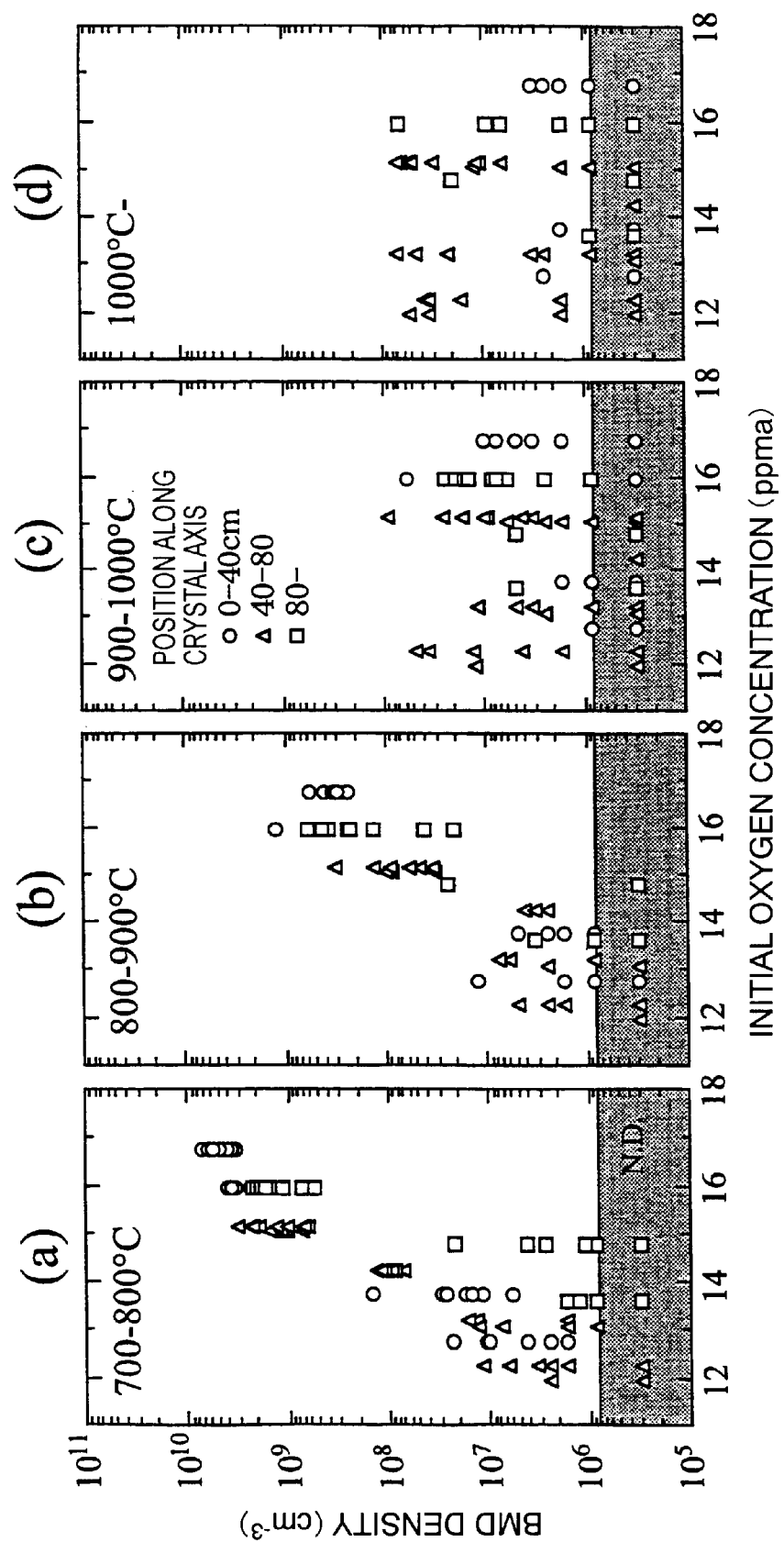
FIG. 2 shows graphs representing oxygen concentration dependency of BMD density.

(2) Oxygen Concentration Dependency
(2-1) Case in which Influence of Position in Crystal is Taken Into Consideration The oxygen concentration dependency of BMD density is shown in FIG. 2. The different symbols (circles, triangles and squares) represent different positions in crystal, and classified into those at distances from crystal shoulder of 0–40 cm, 40–80 cm and 80 cm or more.

FIG. 2(a) shows difference of BMD density at 700° C. and BMD density at 800° C. This difference indicates density of only grown-in precipitation nuclei that can remain at 700° C., but cannot remain at 800° C., i.e., extremely small precipitation nuclei. These results show that the oxygen concentration dependency of the density of small precipitation nuclei was strong and the density decreased when the oxygen concentration became low. Further, it can be also seen that the density also showed dependency for the position in crystal, and the density decreased at positions at distances of 80 cm or more from the crystal shoulder.

Although the oxygen concentration dependency was also seen for the density of precipitation nuclei stable at 800–900° C. as shown in FIG. 2(b), the influence of the position in crystal was not clearly observed.

On the other hand, as shown in FIGS. 2(c) and (d), it can be seen that the density of only large precipitation nuclei stable at 900–1000° C. or above 1000° C. showed substantially no oxygen concentration dependency and no dependency for the position in crystal.

(2-2) Case in which Influence of Defect Region is Taken into Consideration

The results for a case in which the influence of defect region was taken into consideration for the oxygen concentration dependency of BMD density are shown in FIG. 3. The data for positions near boarders between defect regions are omitted. As the temperature region shifted to a higher region, i.e., precipitation nucleus size became larger, the influence of defect regions was more clearly observed. As shown in FIGS. 3(c) and (d), the density of precipitation nuclei stable at 900–1000° C. or above 1000° C. was clearly higher in the OSF ring region and the NV-region. However, there was almost no oxygen concentration dependency.

Combining the results of (2-1) and (2-2), the following can be appreciated.

Although density of relatively small grown-in precipitation nuclei strongly depends on the oxygen concentration and position in crystal, it is unlikely to be influenced by the defect regions. On the other hand, density of large grown-in precipitation nuclei stable at high temperature is hardly influenced by the oxygen concentration or position in crystal, but it is strongly dependent on the defect regions.

(3) Uniformity of Oxygen Precipitation in Plane

As described above, it was found that the thermal stability of grown-in precipitation nuclei was strongly dependent on the defect regions defined based on the OSF ring. Therefore, it is readily expected that a wafer having two or more defect regions shows bad uniformity of oxygen precipitation in its plane. The results showing it are shown in FIGS. 4(a) to 4(f) and 5(a) to 5(h).

(3-1) Case of High Oxygen Concentration Wafers

The results for high oxygen concentration wafers (15–17 ppma) are shown in FIGS. 4(a) to 4(f). The different symbols represent different heat treatment starting temperatures. Wafers containing two or more kinds of defect regions showed bad uniformity of BMD density in plane when the temperature was high (FIGS. 4(c) to (f)). This is because the density of large grown-in precipitation nuclei stable at a high temperature is strongly influenced by the defect regions as described in (2). However, if the temperature became low, the uniformity in plane was improved. This is because the density of small grown-in precipitation nuclei is hardly influenced by the defect regions, but it is strongly dependent on the oxygen concentration. As for the influence of the device production process, it is estimated from these results that uniformity of the BMD density in plane would not be degraded if a low temperature process using a low first stage temperature (700–800° C.) is used, whereas the uniformity in plane would be degraded if a high temperature process using a high first stage temperature (about 900° C.) is used. This is considered to constitute a problem for conventional low defect crystals.

(3-2) Case of Low Oxygen Concentration Wafers

The results for low oxygen concentration wafers (12–14 ppma) are shown in FIGS. 5(a) to 5(h). Compared with the high oxygen concentration wafers, the distribution of BMD density in plane was degraded in the low oxygen concentration wafers even when the heat treatment starting temperature was low. This is because the density of small precipitation nuclei decreases when the oxygen concentration is low, and hence large precipitation nuclei strongly influenced by the defect regions become dominant at any temperature. From these results, it is suggested that low oxygen concentration wafers would show bad uniformity of BMD density in plane in any kind of device production process.

The inventors of the present invention further studied assiduously based on the findings obtained in the above (1) to (3), and made the following considerations as for methods for stably obtaining the BMD density by any type of device production processes covering from a high temperature process to a low temperature process. Thus, they accomplished the present invention. A conceptual diagram concerning the following discussions is shown in FIG. 6.

<Consideration 1>
Method for Reducing Fluctuation of BMD Depending on Position in Crystal The substantial problem in the control of oxygen precipitation is its significant fluctuation depending on position in crystal. In the experiments performed by the inventors of the present invention, it was found that the influence of position in crystal was significant for the density of small precipitation nuclei stable at 700–800° C. It is considered that these precipitation nuclei are formed in a temperature range of 700° C. or lower in the thermal history of crystal. That is, the fluctuation depending on the position in crystal may be reduced by using the same thermal history at 700° C. or lower for the top portion (shoulder side (K side)) and the bottom portion (tail side (P side)) of a crystal. However, this is extremely difficult. Then, it was considered that the fluctuation depending on the position in crystal could be reduced by lowering the density. Based on the results shown in FIG. 2, it is considered that the oxygen concentration must be 14 ppma or lower in order to lower the density of small precipitation nuclei. If it exceeds 14 ppma, it becomes difficult to decrease the fluctuation depending on the position in crystal, which is the object of the present invention. This conception of eliminating the dependency of oxygen precipitation on the position in crystal can be also applied to a case using nitrogen doping, and the oxygen concentration can be similarly made to be 14 ppma or less.

<Consideration 2>
Method for Forming Thermally Stable Grown-in Precipitation Nuclei In order to stably obtain BMDs for different device production processes, thermally stable large precipitation nuclei are required. The density of large precipitation nuclei strongly depends on the type of defect region, and the density becomes high in the OSF ring region and the NV-region. However, since OSFs may be generated during a high temperature process in the OSF ring region, it is thought that the optimum region is the NV-region.

Taking Consideration 1 into account, it can be said that a wafer that stably provides BMDs regardless of position in crystal and device production process should be a wafer having an oxygen concentration of 14 ppma or less and an NV-region for the whole plane (or NV-region containing an OSF ring region for the whole plane or the OSF ring region for the whole plane). However, in the conventional NV-region, the precipitation nuclei density is in an order of $10^7/cm^3$, and it cannot necessarily be said that it is sufficient.

<Consideration 3>
Method for Increasing Precipitation Nuclei Density in NV-region Since the density of thermally stable large precipitation nuclei hardly depends on the oxygen concentration as shown in FIG. 3, increase of the density cannot be expected by using a higher oxygen concentration.

Now, the mechanism of the formation of stable precipitation nuclei in the NV-region is considered. A conceptual diagram therefor is shown in FIG. 7. In NV-region, by controlling the crystal pulling condition: F/G (F: pulling rate, G: temperature gradient near growth surface), supersaturation degree of vacancies is decreased and therefore the formation of voids is inhibited. This makes the vacancies more excessive in the NV-region compared with a region in which voids are formed at a temperature lower than the void formation temperature range. The phenomenon that the oxygen precipitation nucleation is accelerated by excessive vacancies at a relatively high temperature has been confirmed by various experiments. That is, it is considered that, in the NV-region, the precipitation nucleation is accelerated by excessive vacancies at a relatively high temperature (considered to be in the range of about 1000–750° C.). When the nuclei are formed at a high temperature, they can be sufficiently grown by the subsequent cooling step, and therefore they become thermally stable precipitation nuclei of large size.

Based on the mechanism described above, the density of thermally stable precipitation nuclei will be increased when the vacancy concentration becomes higher. However, when the vacancy concentration becomes higher, the void formation is promoted, and as a result, the concentration of vacancies contributing to the precipitation nucleation is decreased. Therefore, there is required a certain method that can inhibit aggregation of the vacancies even if the vacancy concentration is high.

Then, use of nitrogen doping was conceived. While it is shown in FIG. 6, if nitrogen is doped, aggregation of the excessive vacancies will be inhibited and remaining excessive vacancies will promote the precipitation nucleation at a high temperature. As a result, the density of thermally stable precipitation nuclei will increase. However, the region inside the OSF ring cannot be used, because many micro COPs (micro void defects) present in that region degrade device characteristics. Therefore, an NV-region of a nitrogen-doped crystal is preferred, and it shows an effect that stable oxide precipitates can be obtained without depending on the device production process.

An exemplary structure of apparatus for pulling a single crystal by the CZ method used in the present invention will be explained hereafter by referring to FIG. 9. As shown in FIG. 9, the apparatus 30 for pulling a single crystal is constituted by a pulling chamber 31, crucible 32 provided in the pulling chamber 31, heater 34 disposed around the crucible 32, crucible-holding shaft 33 for rotating the crucible 32 and rotation mechanism therefor (not shown in the figure), seed chuck 6 for holding a silicon seed crystal 5, wire 7 for pulling the seed chuck 6, and winding mechanism (not shown in the figure) for rotating and winding the wire 7. The crucible 32 is composed of an inner quartz crucible for accommodating a silicon melt (molten metal) 2, and an outer graphite crucible. Further, a heat insulating material 35 surrounds the outside of the heater 34.

Further, in order to establish production conditions used for the production methods of the present invention, an annular solid-liquid interface heat insulating material 8 is provided around the periphery of the solid-liquid interface 4 of the crystal 1, and an upper surrounding heat insulating material 9 is provided thereon. This solid-liquid interface heat insulating material 8 is provided so as to form a gap 10 of 3–5 cm between its lower end and the melt surface 3 of silicon melt 2. The upper surrounding heat insulating material 9 may not be used depending on the conditions. Further, a cylindrical cooling apparatus not shown in the figure may be provided for cooling the single crystal by blowing cooling gas or shielding the radiant heat.

As another method, the so-called MCZ method is recently often used, in which a non-illustrated magnet is additionally installed outside the pulling chamber 31 in the horizontal direction, and a horizontal or vertical magnetic field is applied on the silicon melt 2 so as to prevent convection of the melt and realize stable growth of a single crystal.

As an exemplary method for pulling a silicon single crystal by using the aforementioned apparatus 30, a method for growing a nitrogen-doped single crystal will be explained hereafter. First, a silicon polycrystal raw material of high purity is melted in the crucible 32 by heating it to a temperature higher than the melting point (about 1420° C.). At this point, silicon wafers having a nitride film, for example, are added in order to dope nitrogen. Then, a tip end of the seed crystal 5 is brought into contact with the surface of the melt 2, or immersed into the melt 2 at its approximate center portion by reeling out the wire 7. Subsequently, the crucible-holding shaft 33 is rotated in an optional direction, and at the same time the seed crystal 5 is pulled upwardly by winding up the wire 7 with rotating the wire to start the growing of single crystal. Thereafter, a single crystal ingot 1 approximately in a cylindrical shape can be obtained by suitably controlling the pulling rate and temperature.

In this case, according to the present invention, in order to control the temperature gradient in the crystal, the gap 10 between the lower end of the solid-liquid interface heat insulating material 8 and the melt surface 3 of the silicon melt 2 is controlled, at the same time, the solid-liquid interface heat insulating material 8 in a ring shape is disposed in a region in which the temperature of the crystal near the melt surface is in a temperature range of, for example, 1420–1400° C., in the space surrounding a liquid portion of the single crystal ingot 1 above the melt surface in the pulling chamber 31, and the upper surrounding heat insulating material 9 is disposed thereon. Further, if required, the temperature can be controlled by providing an apparatus for cooling the crystal above the insulating material so that the crystal can be cooled by blowing a cooling gas to it from the above, and providing a collar for shielding the radiant heat at the lower part of a cylinder.

Hereafter, the present invention will be explained with reference to the following specific examples. However, the present invention is not limited to these.

EXAMPLE 1

Raw material polycrystal silicon was charged into a quartz crucible having a diameter of 24 inches, and a single crystal ingot of p-type having a diameter of 8 inches, orientation of <100> and interstitial oxygen concentration of 12–14 ppma (according to JEIDA (Japan Electronic Industry Development Association) standard) was pulled by the CZ method, while F/G was controlled so that a single crystal ingot having NV-region for the whole plane should be formed. In this pulling operation, the oxygen concentration was controlled by controlling rotation of the crucible during the pulling. Two kinds of single crystal ingots were pulled as described above with or without adding silicon wafers having a predetermined amount of silicon nitride films to the polycrystal raw material beforehand, and mirror-polished wafers having NV-region for the whole plane (nitrogen-doped wafer and non-nitrogen-doped wafer) were produced from the above single crystal ingots.

Each nitrogen-doped wafer was sliced at a position having a nitrogen concentration of $1 \times 10^{14}$ number/cm$^3$, which was calculated from the amount of nitrogen added to the raw material polycrystal and the segregation coefficient of nitrogen, and processed into the wafer.

These wafers were subjected to a heat treatment, in which the wafers were loaded into a furnace set at 1000° C. instead of a first stage heat treatment of device production process, and then the temperature was increased from 1000° C. to 1050° C. at a rate of 1.5° C./min and maintained at 1050° C. for 4 hours. Then, BMD density of the wafers after the heat treatment was measured by the infrared laser scattering tomography method (LST). The measurement was performed at a position at a distance of 10 mm from the edge and those at distances increased by a 10 mm interval toward the center for a region having a depth of about 50–180 μm from the surface.

As a result, the BMD density was $3 \times 10^9$ to $8 \times 10^9$ number/cm$^3$ for the nitrogen-doped wafer, and $2 \times 10^7$ to $5 \times 10^7$ number/cm$^3$ for the non-nitrogen-doped wafer. Therefore, it was found that both of the wafers could have a BMD density of significant level with superior uniformity in plane even though they were subjected to a heat treatment at a relatively high temperature for the first stage of the device production process. That is, this indicates that grown-in oxygen precipitation nuclei of large size stable at a high temperature were uniformly formed in plane for both of the wafers. Further, in the case of the nitrogen-doped wafer, a quite high BMD density was obtained and it was found to have extremely high gettering effect.

EXAMPLE 2

A wafer of which defect region was unknown was divided into two pieces. One of the pieces was loaded into a furnace set at 800° C., and the temperature was increased at a rate of 1.5° C./min from 800° C. to 1050° C. and maintained at 1050° C. for 4 hours so that precipitation nuclei should grow to have a detectable size.

Similarly, the other piece was loaded into a furnace set at 1000° C., and the temperature was increased at a rate of 1.5° C./min from 1000° C. to 1050° C. and maintained at 1050° C. for 4 hours so that precipitation nuclei should grow to have a detectable size.

Then, BMD density of each piece after the heat treatment was measured by infrared laser scattering tomography method (LST). The measurement was performed at a position at a distance of 10 mm from the edge and those at distances increased by a 10 mm interval toward the center for a region having a depth of about 50–180 μm from the surface.

The BMD density was $1 \times 10^9$ number/cm$^3$ for the wafer for which the temperature was increased from 800° C., and $3 \times 10^6$ number/cm$^3$ for the wafer for which the temperature was increased from 1000° C. That is, the difference of BMD densities for the temperatures of 800° C. and 1000° C. was in an order of two figures or more, and therefore it could be determined that the defect region of this wafer was a V-rich region inside the OSF ring.

The present invention is not limited to the embodiments described above. The above-described embodiments are mere examples, and those having the substantially same structure as that described in the appended claims and providing the similar functions and advantages are included in the scope of the present invention.

For example, the aforementioned embodiments were explained for cases where silicon single crystals having a diameter of 8 inches were grown. However, the present invention is not limited to them, and can also be applied to silicon single crystals having a diameter of 6 inches or less, or 10–16 inches or larger.

What is claimed is:

1. A silicon wafer having an NV-region or an NV-region containing an OSF ring region for the entire plane of the silicon wafer and having an interstitial oxygen concentration of 14 ppma or less.

2. A silicon wafer obtained by slicing a silicon single crystal ingot grown by the Czochralski method with nitrogen doping, wherein the silicon wafer has an NV-region or an NV-region containing an OSF ring region for its entire plane.

3. The silicon wafer according to claim 2, wherein nitrogen concentration doped in the silicon wafer is $1 \times 10^{10}$ to $5 \times 10^{15}$ number/cm$^3$.

4. The silicon wafer according to claim 3, wherein interstitial oxygen concentration of the silicon wafer is 14 ppma or less.

5. The silicon wafer according to claim 2, wherein interstitial oxygen concentration of the silicon wafer is 14 ppma or less.

6. A method for producing a silicon wafer, wherein, when a silicon single crystal is grown by the Czochralski method, the crystal is pulled with such conditions as present in an NV region or an OSF ring region in a defect distribution chart showing defect distribution which is plotted with D [mm] in the horizontal axis and F/G [mm$^2$/° C.·min] in the vertical axis, wherein D represents a distance between center of the crystal and periphery of the crystal, F [mm/min] represents a pulling rate and G [° C./mm] represents an average temperature gradient in the crystal along the crystal pulling axis direction in the temperature range of from the melting point of silicon to 1400° C., so that interstitial oxygen concentration should become 14 ppma or less.

7. A method for producing a silicon wafer, wherein, when a silicon single crystal is grown by the Czochralski method, the crystal is pulled with such conditions as present in an NV region or an OSF ring region in a defect distribution chart showing defect distribution which is plotted with D [mm] in the horizontal axis and F/G [mm$^2$/° C.·min] in the vertical axis, wherein D represents a distance between center of the crystal and periphery of the crystal, F [mm/min] represents a pulling rate and G [° C./mm] represents an average temperature gradient in the crystal along the crystal pulling axis direction in the temperature range of from the melting point of silicon to 1400° C., and with nitrogen doping.

8. The method for producing a silicon wafer according to claim 6, wherein nitrogen concentration to be doped is $1 \times 10^{10}$ to $5 \times 10^{15}$ number/cm$^3$.

9. The method for producing a silicon wafer according to claim 8, wherein, when a crystal is grown by the CZ method, the crystal is pulled so that interstitial oxygen concentration should become 14 ppma or less.

10. The method for producing a silicon wafer according to claim 7, wherein, when a crystal is grown by the CZ method, the crystal is pulled so that interstitial oxygen concentration should become 14 ppma or less.

11. A method for evaluating defect regions of a silicon wafer produced by the CZ method, wherein a defect region of a silicon wafer to be evaluated is evaluated by comparing at least two of oxide precipitate densities measured by the following steps:

(1) a wafer to be evaluated is divided into two or more pieces (A, B, . . . ), (2) Wafer piece A among the divided pieces is loaded into a heat treatment furnace maintained at a temperature of T1 [° C.] selected from a temperature range of 600–900° C., (3) the temperature is increased from T1 [° C.] to a temperature of 1000° C. or higher, T2 [° C.], at a temperature increasing rate of t [° C./min] (provided that t is 3° C./min or less), and the temperature is maintained until oxide precipitates in Wafer piece A grow to have a detectable size, (4) Wafer piece A is unloaded from the heat treatment furnace, and oxide precipitates density in the wafer piece is measured, (5) another wafer piece among the divided wafer pieces, Wafer piece B, is loaded into a heat treatment furnace maintained at a temperature of T3 [° C.] selected from a temperature range of 800–1100° C. (provided that T1<T3<T2), (6) the temperature is increased from T3 [° C.] to the temperature of T2 [° C.] at the temperature increasing rate of t [° C./min], and the temperature is maintained until oxide precipitates in Wafer piece B grow to have a detectable size, and (7) Wafer piece B is unloaded from the heat treatment furnace, and oxide precipitates density in the wafer piece is measured.

* * * * *